(12) United States Patent
Farquhar et al.

(10) Patent No.: US 6,335,495 B1
(45) Date of Patent: Jan. 1, 2002

(54) PATTERNING A LAYERED CHROME-COPPER STRUCTURE DISPOSED ON A DIELECTRIC SUBSTRATE

(75) Inventors: Donald S. Farquhar, Endicott; Edmond O. Fey, Vestal, both of NY (US); Elizabeth F. Foster, Friendsville, PA (US); Michael J. Klodowski, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/343,073

(22) Filed: Jun. 29, 1999

(51) Int. Cl.[7] .................................................. H01K 1/11
(52) U.S. Cl. ........................ 174/262; 174/261; 361/780; 361/794
(58) Field of Search .................................. 174/262, 266, 174/260; 361/780, 794, 795; 257/698

(56) References Cited

U.S. PATENT DOCUMENTS

| | | | |
|---|---|---|---|
| 4,480,288 A | | 10/1984 | Gazdik et al. |
| 4,517,051 A | | 5/1985 | Gazdik et al. |
| 5,128,008 A | | 7/1992 | Chen et al. |
| 5,309,629 A | * | 5/1994 | Traskos et al. ............... 29/830 |
| 5,420,073 A | | 5/1995 | DiGiacomo et al. |
| 5,427,983 A | | 6/1995 | Ahmad et al. |
| 5,629,564 A | | 5/1997 | Nye, III et al. |
| 5,792,375 A | | 8/1998 | Farquhar |
| 6,077,766 A | * | 6/2000 | Sebesta et al. ............... 438/618 |
| 6,132,853 A | * | 10/2000 | Noddin ........................ 428/209 |
| 6,188,027 B1 | * | 2/2001 | Miller et al. ................. 174/262 |

OTHER PUBLICATIONS

VLSI Fabrication Principles, Silicon and Gallium Arsenide, Second Edition, Sorab K. Ghandhi, John Wiley & Sons, Inc., 1994, p. 514.

Vacuum Deposition of Thin Films, Fifth Printing, L. Holland, F.Inst.P., Chapman & Hall Ltd., 1963, pp. 340–341.

"Process Considerations in the Fabrication of Teflon Printed Circuit Boards", by Light et al, 1994 Proceedings, 44 Electronic Components & Technology Conference, May 1994.

"High Performance Carrier Technology: Materials and Fabrication", by Light et al, 1993 International Electronics Packaging Conference, San Diego, California, vol. One.

"High Performance Carrier Technology", by Heck et al, 1993 International Electronics Packaging Conference, San Diego, Vol. One.

* cited by examiner

Primary Examiner—Jeffrey Gaffin
Assistant Examiner—José H. Alcalá
(74) Attorney, Agent, or Firm—Schmeiser, Olsen & Watts; Lawrence R. Fraley

(57) ABSTRACT

An electrical structure, comprising a first dielectric layer, a patterned layer on the first dielectric layer, and a second dielectric layer on the patterned layer. The patterned layer includes a metal pattern on the first dielectric layer, a metallic pattern on the metal pattern, and a plugged pattern within a remaining space of the patterned layer. The plugged pattern includes a dielectric material. The second dielectric layer is adhesively bonded to a top surface of the patterned layer. The second dielectric layer includes the dielectric material.

10 Claims, 7 Drawing Sheets

US 6,335,495 B1

PATTERNING A LAYERED CHROME-COPPER STRUCTURE DISPOSED ON A DIELECTRIC SUBSTRATE

BACKGROUND OF THE INVENTION

1. Technical Field

The present invention relates to a structure, and method of formation, including a patterned layer over a dielectric layer, and a second dielectric layer preferentially including a thermoplastic fluoropolymer (TFP) over the patterned layer, wherein the patterned layer typically includes a chrome pattern on a copper pattern with dielectric material plugging otherwise void space within the patterned layer, and wherein the chrome pattern prevents processing-induced delamination of the second dielectric layer from the patterned layer.

2. Related Art

A laminate (e.g., a chip carrier) made of a dielectric material typically includes internal metalized layers, such as a ground plane, a signal plane, and a power plane. The ground plane, which may include inter alia a copper-invar-copper sandwich of planes, serves to provide a common voltage level of zero volts. Additionally, the ground plane is a large, mechanically stable structure to which small structures within the substrate may be registered for dimensional control during the laminate fabrication process. The signal plane, which may be disposed inter alia between the ground plane and the power plane, is an internal circuitized layer of metallic fine structure such that the metallic fine structure comprises a small percentage (e.g., 5%) of the volume of the signal plane.

The power plane supplies one or more fixed voltages to a circuit, or to an electronic component, that is electrically coupled to the power plane. A power plane includes a metal sheet, such as a copper sheet, which comprises a large percentage of the volume of the power plane (e.g., 95%). A surface of the power plane facing toward the ground plane is an "inner surface," and a surface of the power plane facing away from the ground plane is an "outer surface." A power plane may include a clearance hole plugged with the dielectric material ("dielectric plug"). A plated though hole (PTH) may pass through the power plane of the laminate such that the PTH is encapsulated within the dielectric plug of the clearance hole, resulting in electrical insulation of the PTH from the metal sheet of the power plane.

If the dielectric material of the laminate includes a thermoplastic fluoropolymer (TFP), such as a teflon (e.g., a Rogers 2800 material from the Rogers Corporation), there is a propensity for delamination between the outer surface of the power plane and the dielectric material during process steps in the fabrication of the laminate. Inasmuch as the metal sheet of the power plane may comprise a large percentage (e.g., 95%) of the volume of the power plane, the delamination may have a significant adverse impact on the structural integrity of the laminate. In contrast, there are generally no material delamination concerns relating to the signal plane, since the metallic fine structure of the signal plane comprises only a small percentage (e.g., 5%) of the volume of the signal plane. A source of the delamination relates to the heat generated by laser formation of through holes in the laminate. The TFP material has a low melting point (e.g., the Rogers 2800 material melts at about 327° C.) and readily melts within a localized space near the laser-generated through holes. The local melting of the TFP material and the swelling effect of the high local temperature may cause local delamination of the TFP material from the power plane surfaces. The delamination effect from the laser drilling is mitigated by the use of an oxide pre-treatment of the copper surfaces of the power plane and is sufficiently effective to prevent delamination of the dielectric from the inner surface of the power plane. Nonetheless, the outer surface of the power plane is subject to another source of delamination, namely chemical attack from moisture and chemicals used in various plating, etching, and surface preparation processing steps. Such chemical attack is particularly relevant for TFP dielectrics having a filler material, such as silica or quartz, which are used for structural reinforcement. Inasmuch as a discontinuity exists between the TFP material and the silica particles, there are numerous percolation paths within the dielectric material through which moisture and processing chemicals may flow. The percolation paths enable processing chemicals to easily access the interface between the dielectric layer and the outer surface of the power plane, resulting in degradation of adhesion between the dielectric material and the outer surface of the power plane. The delamination resulting from chemical attack is not a local effect and potentially impacts the entire interface between the outer surface of the power plane and the dielectric layer formed on the outer surface. The problem of chemical attack does not materially affect the inner surface of the power plane, because the power plane itself acts as a percolation barrier to chemical percolation. Additionally, the ground plane serves as a registration reference for dimensional stability purposes, as discussed supra. Accordingly, the fabrication process starts with providing the ground plane and serially adding structural features outward from the ground plane until the laminate is fully developed. Thus, after the ground plane is laminated to the dielectric, chemicals from subsequent processing of the laminate have access primarily to the outer surface, rather than the inner surface, of the power plane.

A method is needed to prevent delamination at the interface between the outer surface of the power plane and the dielectric layer formed on the outer surface.

SUMMARY OF THE INVENTION

The present invention provides a method for forming an electrical structure, comprising:

providing a layered structure, including a dielectric layer, a metal layer on the dielectric layer, and a metallic layer on the metal layer;

forming a patterned layer on the dielectric layer, including etching through the metallic layer, and etching an exposed portion of the metal layer; and plugging a void space within the patterned layer with a dielectric that includes a thermoplastic fluoropolymer (TFP) material, wherein a plugged pattern is formed; and forming a second dielectric layer on the patterned layer, adhesively bonded to a top surface of the patterned layer, wherein the second dielectric layer includes the TFP material.

The present invention also provides a method for forming an electrical structure, comprising:

providing a layered structure, including a dielectric layer, a metal layer on the dielectric layer, and a chrome layer on the metal layer; and forming a patterned layer on the dielectric layer, including etching through the chrome layer, and etching an exposed portion of the metal layer.

The present invention provides an electrical structure, comprising:

a dielectric layer;

a patterned layer on the dielectric layer, including a metal pattern on the dielectric layer, a metallic pattern on the metal pattern, and a plugged pattern having a dielectric material within a remaining space of the patterned layer; and a second dielectric layer on the patterned layer, adhesively bonded to a top surface of the patterned layer, wherein the second dielectric layer includes the dielectric material.

The present invention has the advantage of preventing delamination at an interface between the outer surface of a patterned metallic layer and a dielectric layer adhesively formed on the patterned metallic layer, wherein the dielectric layer includes a TFP material.

Noting that a method of the present invention includes etching through a metallic layer that preferentially comprises chrome, the present invention discloses an effective method for etching chrome located under a hole in a photoresist layer. The disclosed method advantageously etches the chrome without attacking the photoresist. The disclosed method, as applied to very small holes in the photoresist layer, advantageously overcomes surface tension that would otherwise prevent the etchant from fully contacting the chrome material to be etched. The disclosed method advantageously increases the wettability of the sidewall of the hole in the photoresist layer, which facilitates improved coverage of the chrome surface area by the etchant. The disclosed method advantageously overcomes adverse electrochemical effects caused by etching a part while the part is contained within a metallic frame.

DETAILED DESCRIPTION OF THE INVENTION

Figure 1:
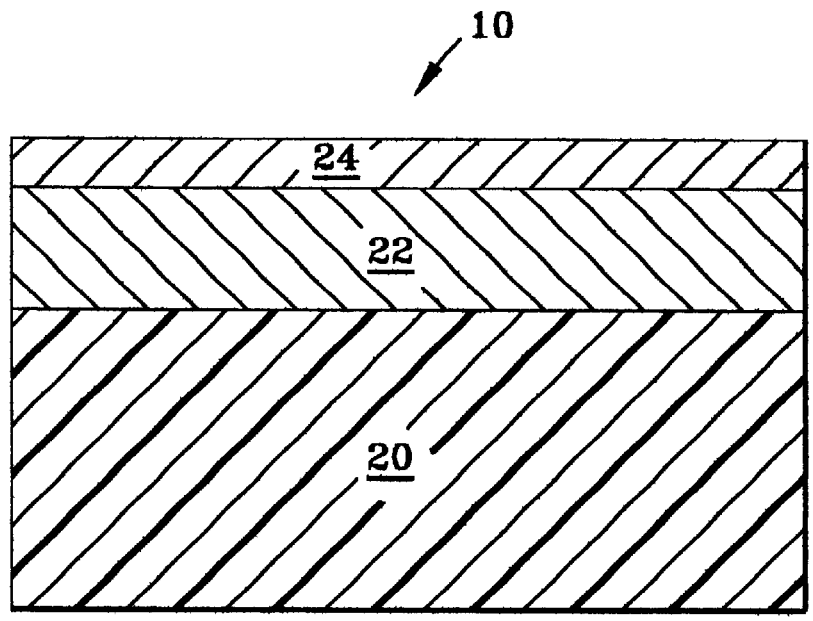
FIG. 1 depicts a front cross-sectional view of a metallic layer on a metal layer on a dielectric layer, in accordance with a first preferred embodiment of the present invention.

FIGS. 1–8 illustrate a first preferred embodiment of the present invention. FIG. 1 illustrates a front cross-sectional view of a layered structure 10, including a metallic layer 24 on a metal layer 22, and the metal layer 22 on a dielectric layer 20. The thickness of the metallic layer 24 should preferably between about 800 Å and about 1200 Å. A thickness of at least about 800 Å provides assurance that metallic layer 24 will cover the metal layer 22 continuously without a gap. A thickness exceeding about 1200 Å can be utilized, but is unnecessary.

The metal layer 22, in combination with the metallic layer 24, will subsequently be transformed into an internally patterned conductive plane such as a power plane. The patterning will remove portions of the metallic layer 24 and corresponding underneath portions of the metallic layer 24. As a result, voids such as clearance holes and clearance borders, to be described infra, are formed in locations where material from the metallic layer 24 and underneath metal layer 22 is removed. After patterning, the metallic layer 24 will facilitate adhesive coupling between the metal layer 22 and a subsequently added second dielectric layer. In the case of a power plane, the patterned metal layer 22 will serve to hold one or more fixed voltages to which circuits and electronic components may tap.

The metal layer 22 preferably comprises copper, but may alternatively include a highly conductive metal such as aluminum, nickel, silver, or gold. The metallic layer preferably comprises chrome, but may also alternatively comprise a metallic substance capable of resisting corrosion when exposed to moisture and chemicals used in subsequent processing. Such alternative metallic substances include inter alia cobalt, nickel, nickel-chromium, and nickel-copper. The dielectric layer 20 preferably includes a thermoplastic fluoropolymer (TFP) material, such as a teflon material, but may alternatively include a thermosetting dielectric material such as a multi-functional epoxy.

Formation of the layered structure 10 may include laminating the metal layer 22 to the dielectric layer 20, and subsequently depositing the metallic 24 layer on the metal layer 22 by use of a suitable process such as sputtering or electroplating. Formation of the layered structure 10 may alternatively include depositing the metallic layer 24 on the metal layer 22 by use of a suitable process such as sputtering or electroplating, and subsequently laminating the metal layer 22 to the dielectric layer 20. Additionally, a surface of the metal 22 layer may be microetched prior to deposition of the metallic layer 24 on the surface, in order to improve adhesion of the metallic layer 24 to the metal layer 22.

Figure 2:
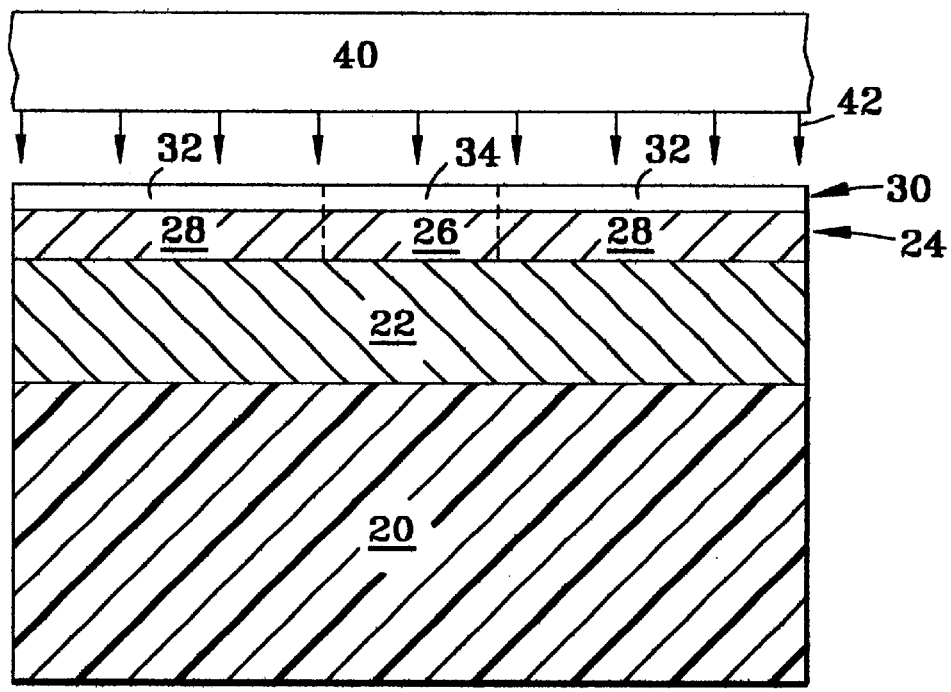
FIG. 2 depicts FIG. 1 after a patterned photoresist layer has been placed on the layered structure and in a path of directed light.
Figure 3:
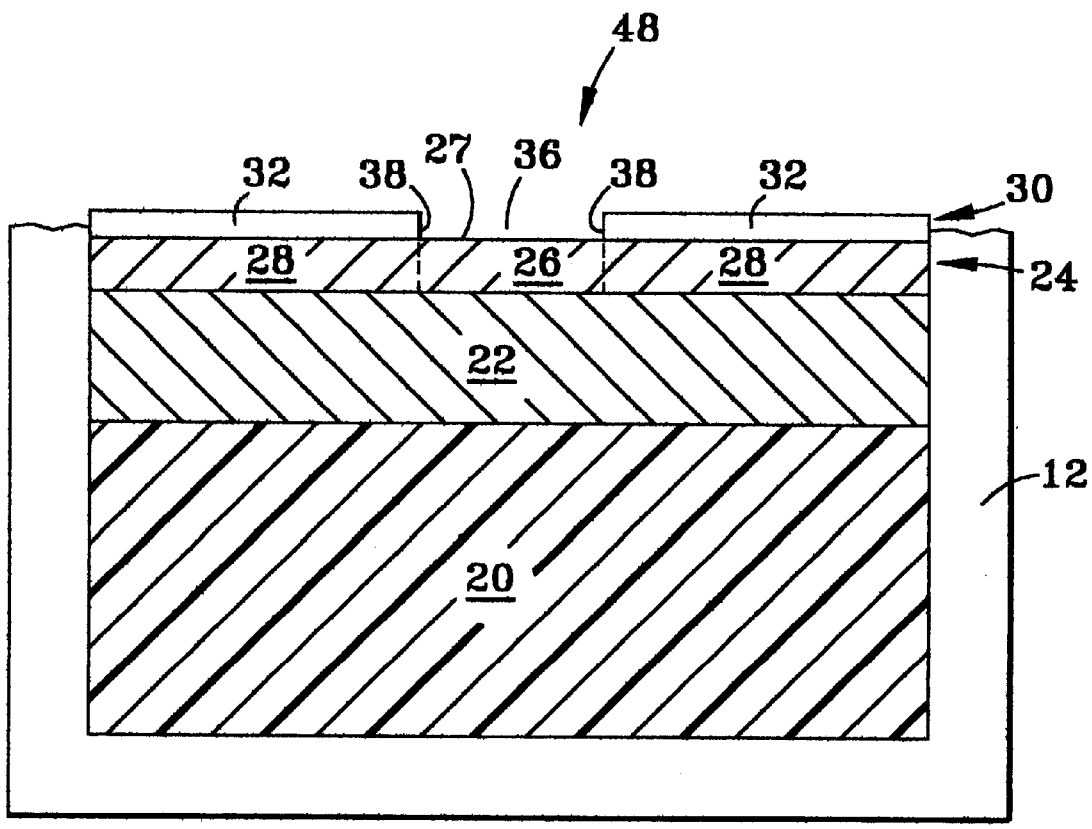
FIG. 3 depicts FIG. 2 after a hole in the photoresist layer has been formed.

FIG. 2 illustrates an initial step in the patterning of the metallic layer 24 and the metal layer 22. In FIG. 2, a patterned photoresist layer 30 is formed on the metallic layer 24, wherein the photoresist layer 30 includes a developable portion 34 and an undevelopable portion 32. The metallic layer 24 includes an etchable portion 26 underneath the developable portion 34 of the photoresist layer 30, wherein the etchable portion 26 is to be subsequently etched away. The metallic layer 24 also includes an non-etchable portion (i.e., a subsequently unetched portion) 28 underneath the undevelopable portion 32 of the photoresist layer 30. Light 42 of a suitable wavelength (e.g., ultraviolet radiation) from a light source 40 is directed onto the photoresist layer 30. The patterning of the photoresist layer allows the light 42 to strike some, but not all, portions of the photoresist layer 30. If the photoresist layer 30 includes a "positive" photoresist, the patterning of the photoresist layer 30 allows the developable portion 34, but not the undevelopable portion 32, to be exposed to the light 42. If the photoresist layer 30 includes a "negative" photoresist, the patterning of the photoresist layer 30 allows the undevelopable portion 32, but not the developable portion 34 to be exposed to the light 42. For either type of photoresist, a developer solution is applied to the photoresist layer 30 and washes away the developable portion 34, but not the undevelopable portion 32. As shown in FIG. 3, the resulting resist-protected layer structure 48 includes a hole 36 having a bounding sidewall 38 in the photoresist layer 30.

Figure 4:
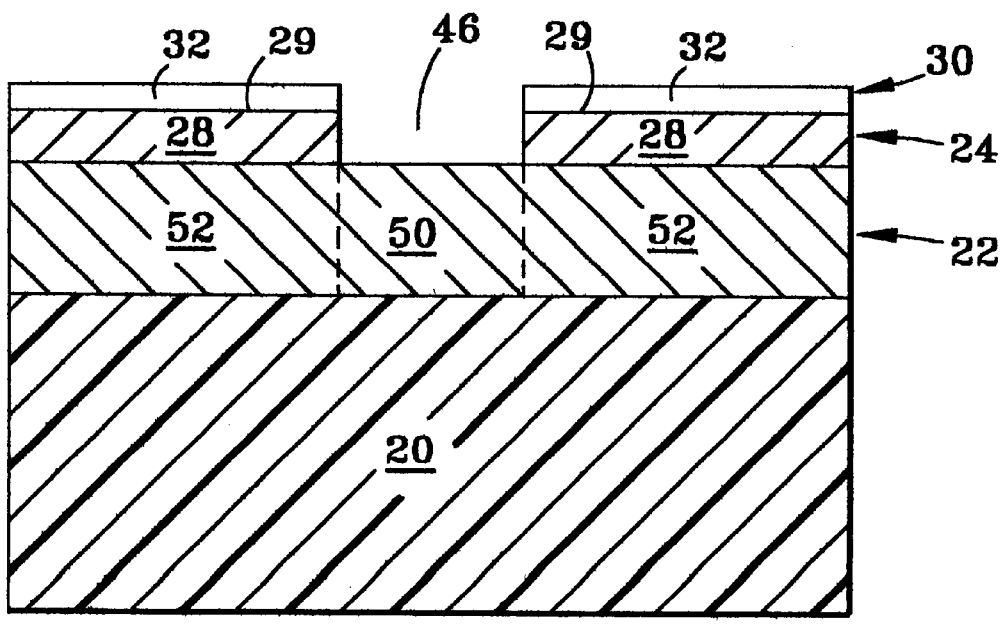
FIG. 4 depicts FIG. 3 after a portion of the metallic layer has been etched away.

Subsequent to developing away developable portion 34 of the photoresist layer 30 and as shown in FIG. 4, the etchable portion 26 of the metallic layer 24 is etched away, leaving a void space 46 in the metallic layer 24 and effectively changing the status of the "non-etchable portion" 28 into that of an "unetched portion." The etching chemical ("etchant") must have the property of not attacking the photoresist. An etchant that meets this requirement and is effective for etching chrome is a hydrochloric acid (HCl) solution having a molar concentration of at least about 0.3 to ensure effective etching. It is preferred that the molar concentration not exceed about 4. At molar concentrations above about 4, care should taken to limit the etch time to a value low enough to insure that the etchant does not "undercut" the photoresist layer 30 (i.e., not attack the top surface 29 of the non-etchable portion 28 of the metallic layer 24). The etchant should be preferably be applied to the chrome at a temperature of at least about 35° C. to ensure effective etching. It is preferred that the temperature not exceed about 70° C. At temperatures above about 70° C. and below the boiling point of the HCl, the etch time should be carefully controlled to avoid the same undercutting as was described supra for molar concentrations exceeding about 4. At temperatures above about 70° C. and near or at the boiling point of the HCl, care must taken to replenish evaporative losses of the HCl.

Various techniques may be used for enhancing the effectiveness of the etching of the developable portion 34 (see FIG. 2) of the photoresist layer 30. A first technique relates to overcoming the surface tension of the etchant, wherein the surface tension impairs the ability of the etchant to cover the entire top surface 27 of the etchable portion 26 (see FIG. 3).

The first techniques thus includes adding a surfactant, such as FC95 (a product of the 3M company), to reduce the surface tension of the etchant. A second technique includes adding sodium chloride (NaCl) to the etchant solution. An addition of NaCl to the HCl solution, as discussed supra in relation to the etching of chrome, reduced the etching time and enhanced the spatial uniformity of the chrome removal. A third technique replaces a metallic frame, which had typically been used for supporting the resist-protected layer structure 48, with a plastic frame 12 as shown in FIG. 3. A metal frame introduces adverse galvanic effects due to electrochemical interaction between the metal frame and metal within the resist-protected layer structure 48. In particular, prior use of a metallic frame resulted in deposition of copper on the metallic frame, which impaired the reliability and reproducibility of the fabrication process. These problems were alleviated when the plastic frame 12 was used instead of a metal frame.

Figure 5:
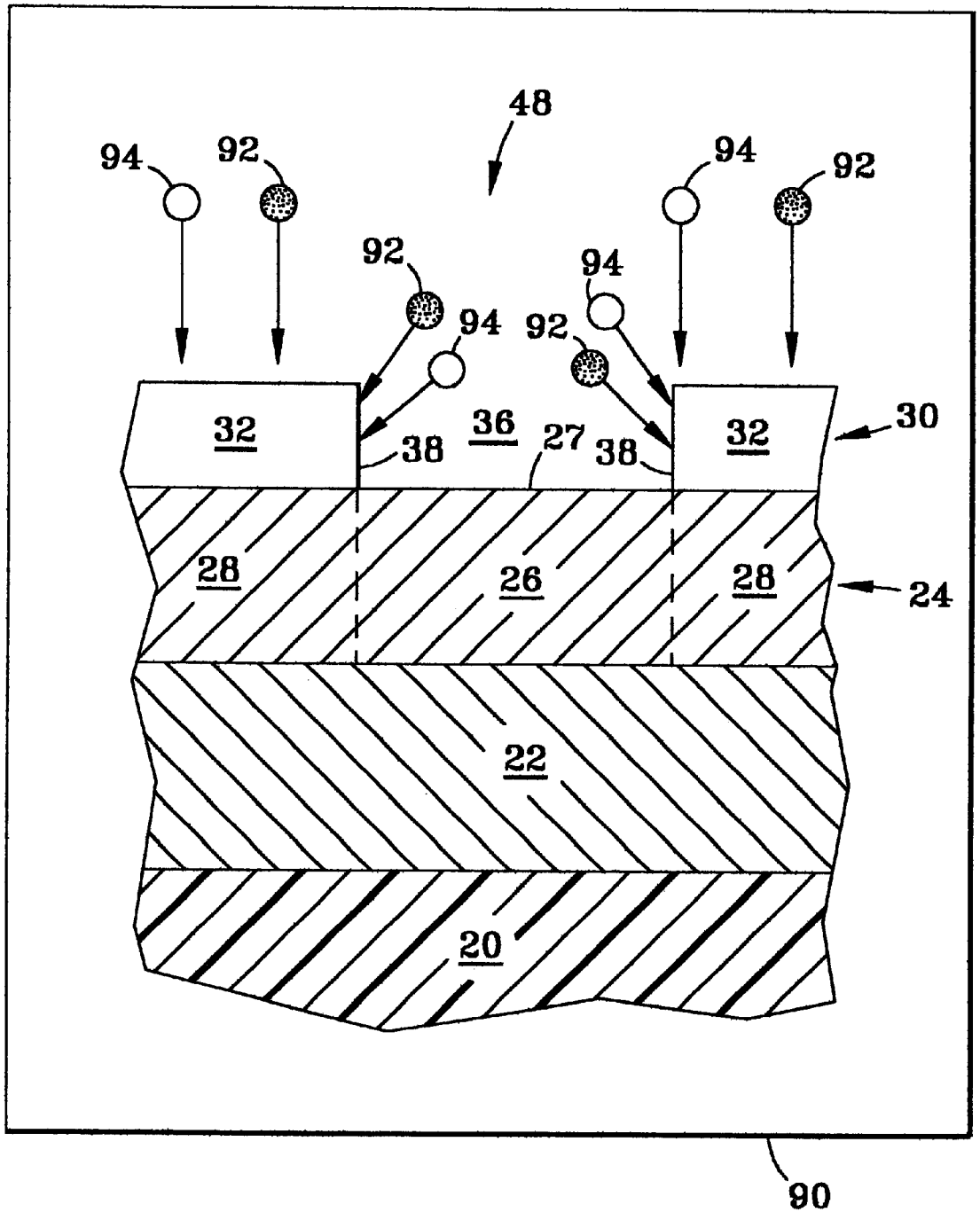
FIG. 5 depicts the structure of FIG. 3 placed within a plasma reactor chamber to treat a sidewall of the hole in the photoresist layer.

A fourth techniques found useful for enhancing the effectiveness of the etching of the developable portion 34 of the photoresist layer 30 includes plasma pretreatment of the resist-protected layer structure 48, as shown in FIG. 5. The plasma pretreatment, which precedes etching of the etchable portion 26 of the metallic layer 24, serves to increase wettability of the sidewall 38 of the hole 36 in the photoresist layer 30. The need for enhanced wettability is particularly relevant if the flow area of the hole 36 is small enough to trap air with in the hole 36, which prevents the etchant from fully contacting the top surface 27 of the etchable portion 26. Increasing the wettability of the sidewall 38 serves to attract etchant to the sidewall 38, which promotes the ability of the etchant to displace an otherwise trapped air bubble within the hole 36. In FIG. 5, a plasma reactor chamber 90 holds the resist-protected layer structure 48. The air from the plasma reactor chamber 90 is evacuated to a low pressure (e.g., at or below about 100 millitorr, noting that a torr is equivalent to a millimeter of mercury) and is replaced by gaseous oxygen. Electrical energy at low frequency (e.g., about 40 khz) applied to the plasma reactor chamber 90 energizes the oxygen gas, resulting in a dissociation into oxygen atoms 92 and an ionization into oxygen ions 94. The oxygen atoms 92 and the oxygen ions 94 react with the sidewall 38 of the photoresist layer 30 in a manner that forms functional groups, such as hydroxyl groups, that increases the oxygen content of the organic surfaces of the sidewall 38. As a result, the organic groups become more wettable.

Figure 6:
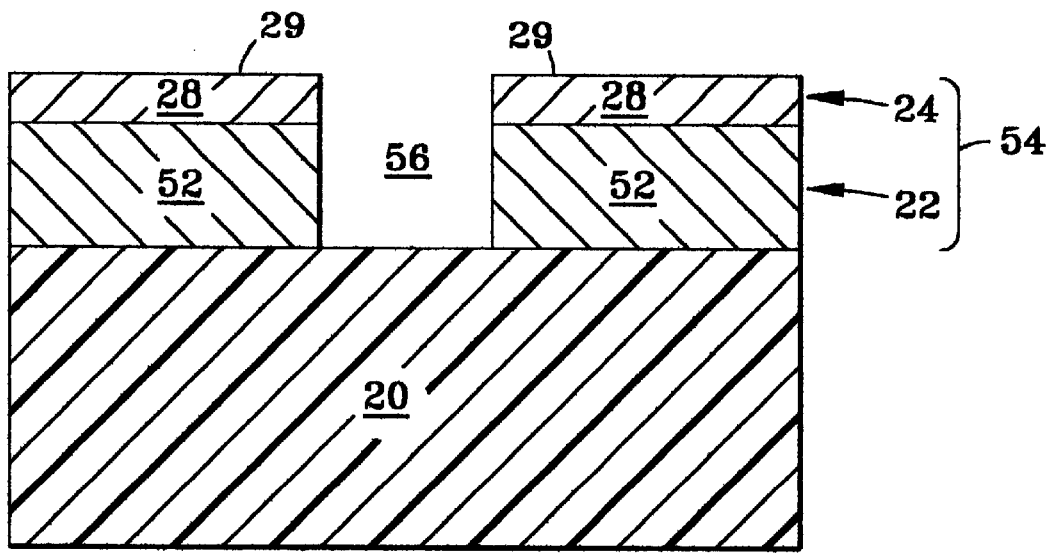
FIG. 6 depicts FIG. 5 after a portion of the metal layer has been etched away.
Figure 8:
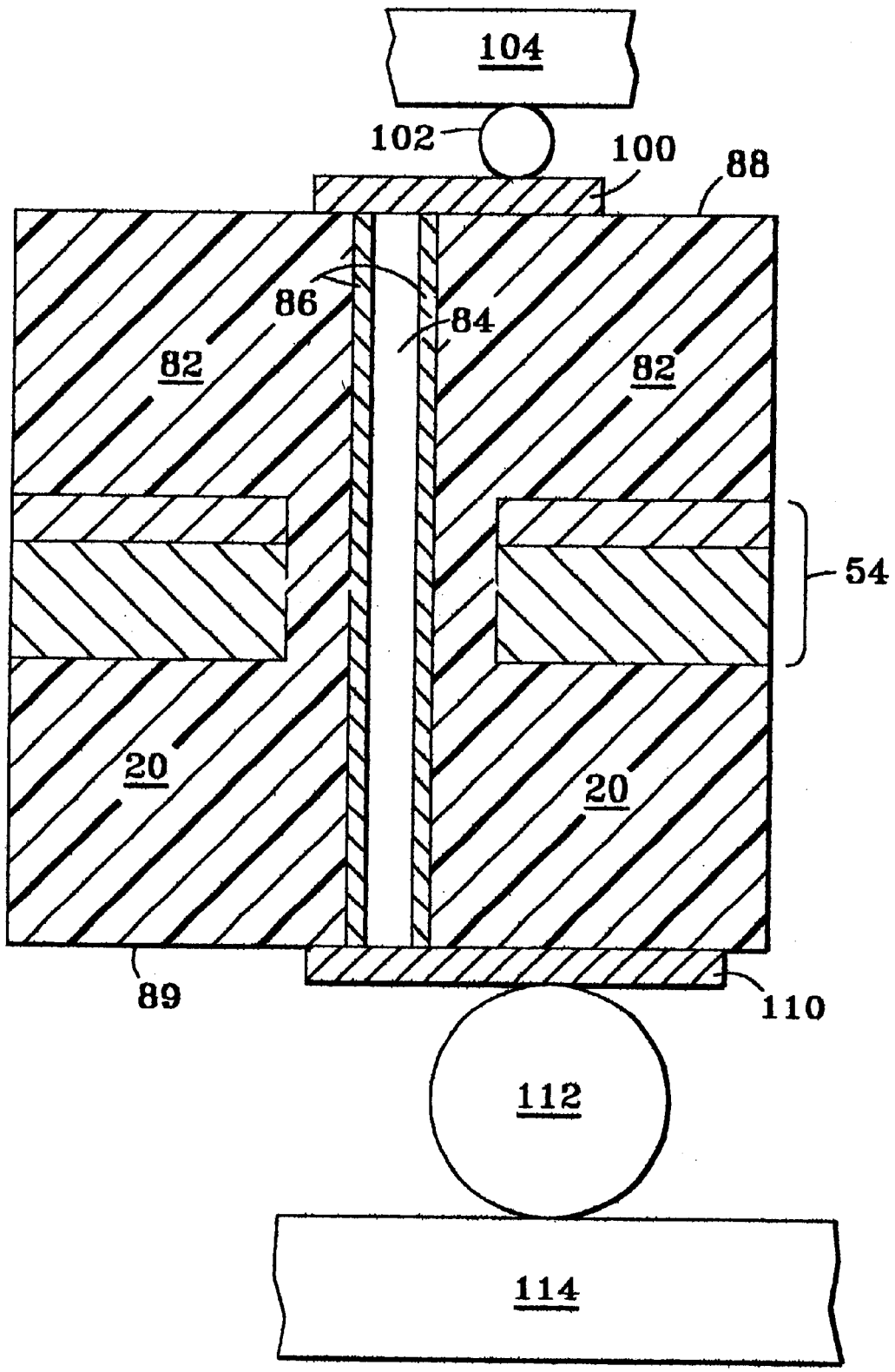
FIG. 8 depicts FIG. 7 with an addition of conductive structure and electronic devices.

After the etchable portion 26 of the metallic layer 24 has been removed, an etchable portion 50 of the metal layer 22, as illustrated in FIG. 4, is etched away by any process known in the art. For example, if the metal layer 22 comprises copper, an effective etchant is cupric chloride. After the unetched portion 50 of the metal layer 22 is removed, an unetched portion 52 of the metal layer 22 remains and a void space 56 is formed, as shown in FIG. 6. The patterning of the metallic layer 24 and the metal layer 22 forms a conductive plane 54, such as a power plane, that includes the void space 56 caused by the prior etching of both the metallic layer 24 and the metal layer 22. The void space 56 may serve various functions. For example, the void space 56 may serve as a clearance hole, and a plated through hole (PTH) may be subsequently formed within the clearance hole for the purpose of electrically coupling electrical circuit patterns as well as electrical devices, as illustrated in FIG. 8 and discussed infra. The void space 56 may also serve as a clearance border for the purpose of providing insulative decoupling of conductive regions within a conductive plane, such as the conductive plane 60 illustrated in FIG. 9 and discussed infra. After the conductive plane 54 is formed, the undevelopable portion 32 of the photoresist layer 30 (see FIG. 4) is stripped away by any method known in the art.

Figure 7:
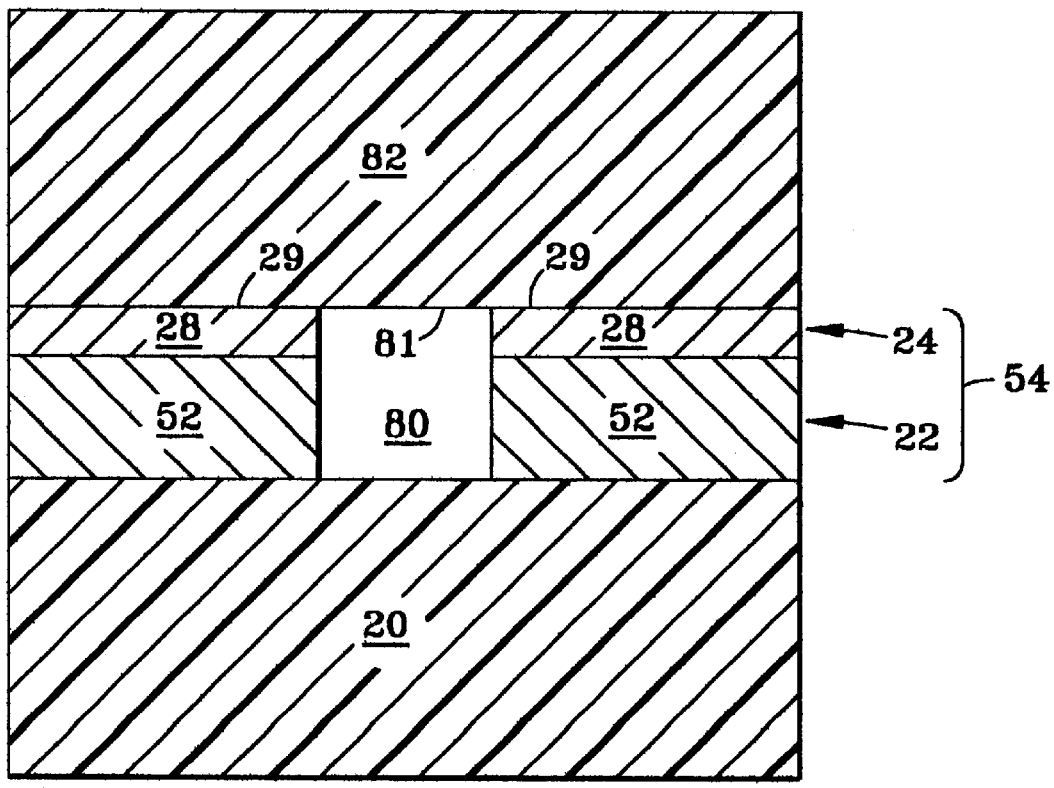
FIG. 7 depicts FIG. 6 after addition of a dielectric plug and a dielectric layer.

FIG. 7 illustrates FIG. 6 after the void space 56 is filled with a dielectric plug 80, preferentially comprising thermoplastic fluoropolymer (TFP) material. Additionally, a dielectric layer 82, which preferentially comprises TFP material, is formed on a top surface 29 of the unetched portion 28 of the metallic layer 24, and on a top surface 81 of the dielectric plug 80. The dielectric plug 80 and the dielectric layer 82 may be formed either concurrently or in sequence, and collectively comprise a continuous volume of dielectric material. If TFP dielectric material is used for the dielectric plug 80 and/or the dielectric layer 82, such TFP dielectric material may include inter alia TEFLON materials such as the Rogers 2800 material from the Rogers Corporation, as well as any of the fluorinated polymeric materials enumerated in col. 3, lines 2–34 of U.S. Pat. No. 5,792,375 (Farquhar, Aug. 11, 1998), hereby incorporated by reference. The metallic layer 24 serves to prevent delamination of the metal layer 22 from the dielectric layer 82 during subsequent processing steps.

FIG. 8 illustrates FIG. 7 with an addition of conductive structure and electronic devices. A plated through hole (PTH) 84, having a plated wall 86, extends from a surface 88 of the dielectric layer 82 to a surface 89 of the dielectric layer 20, and is insulatively encapsulated within the conductive plane 54 by the dielectric plug 80. Thus, the space occupied by the dielectric plug 80, formerly the void space 56 in FIG. 6, is functionally a clearance hole for the PTH 84 in FIG. 8. The PTH 84 is electrically coupled to a circuitization layer 100 on the surface 88. The circuitization layer 100 is coupled to an electronic device 104 by use of an interconnect 102. The electronic device 104 may include inter alia an electronic assembly such as a chip, and the electric interconnect 102 may include inter alia a controlled collapse chip connection (C4) solder ball. The PTH 84 is also electrically coupled to a circuitization layer 110 on the surface 89. The circuitization layer 110 is coupled to an electronic device 114 by use of an interconnect 112. The electronic device 114 may include inter alia an electronic carrier such as a circuit card, and the electric interconnect 112 may include inter alia a ball grid array (BGA) solder ball.

Figure 9:
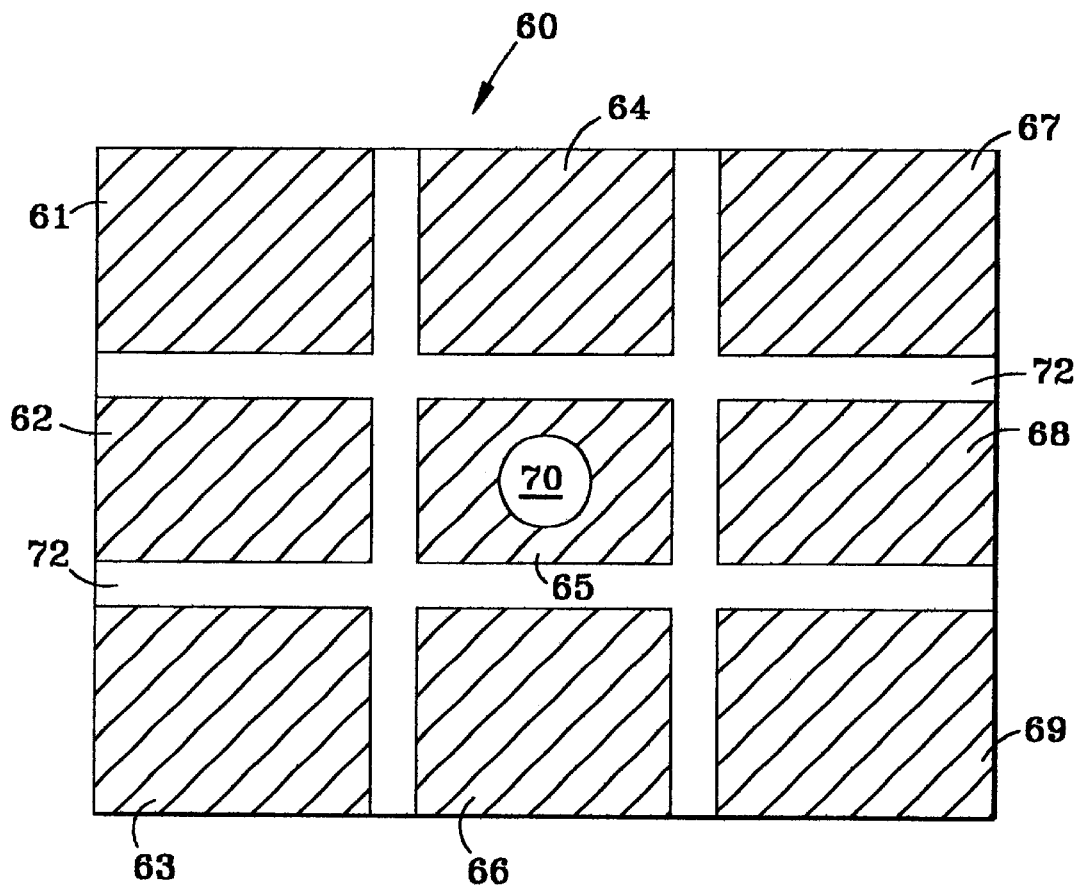
FIG. 9 depicts a top cross-sectional view of a conductive plane with insulatively separated conductive regions, in accordance with a second preferred embodiment of the present invention.

As stated supra in connection with FIG. 6, the void space 56 within the conductive plane 54 may serve inter alia as a clearance hole or as a clearance border. Accordingly, FIG. 9 illustrates a top cross-sectional view of a conductive plane 60 with insulatively separated conductive regions 61–69, in accordance with a second preferred embodiment of the present invention. The clearance border 72, which may be formed by process steps such those that formed the void space 56 in FIG. 6, provides the insulative separation among conductive regions 61–69. Additionally, conductive region 65 includes a clearance hole 70.

Figure 10:
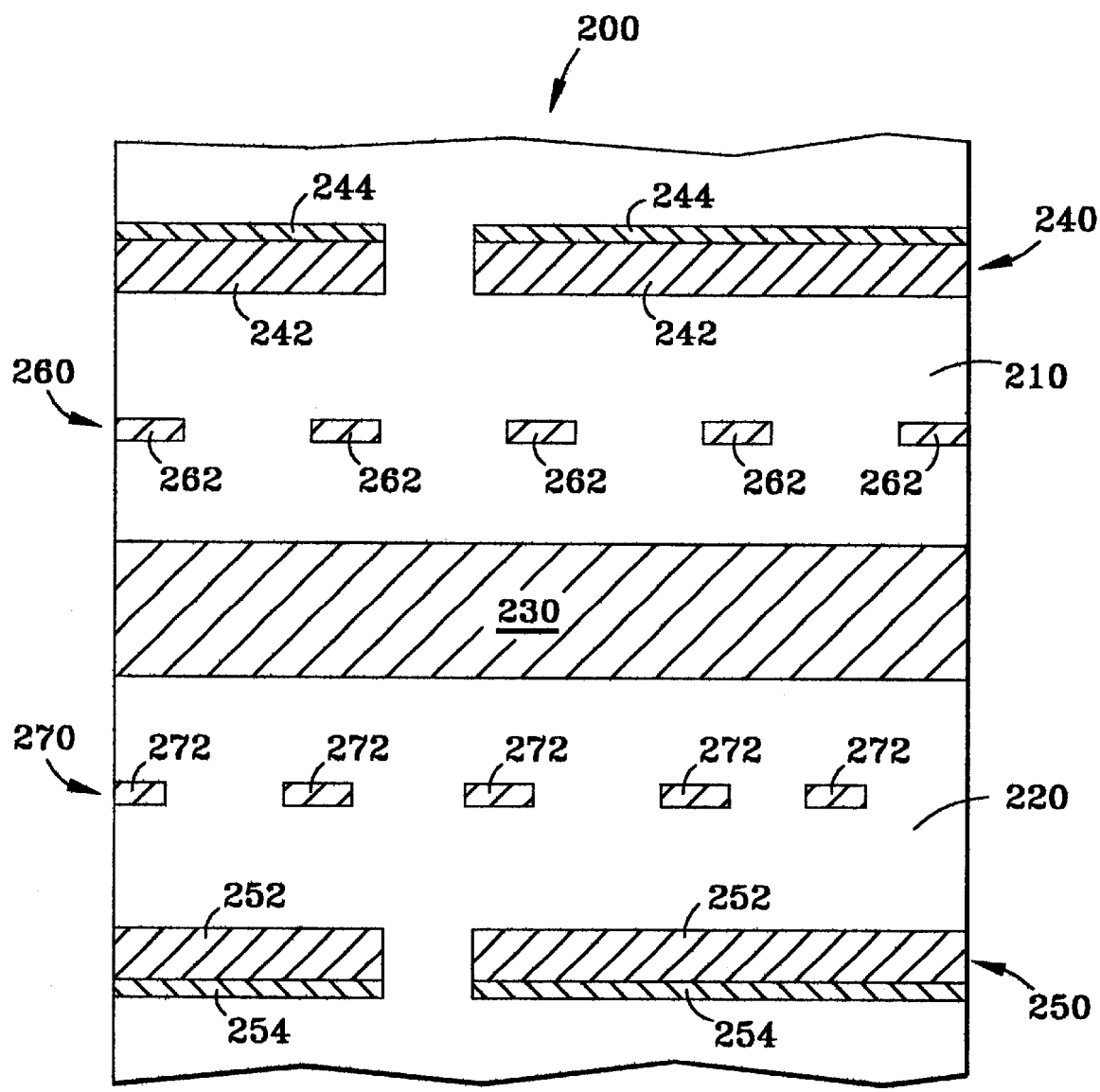
FIG. 10 depicts a front cross-sectional view of a substrate having a ground plane, signal planes, and power planes, in accordance with a third preferred embodiment of the present invention.

FIG. 10 depicts a front cross-sectional view of a substrate 200 that includes a dielectric 210, a dielectric 220, a ground plane 230, signal planes 260 and 270, and power planes 240 and 250, in accordance with a third preferred embodiment of the present invention. The dielectric 210 and/or the dielectric 220 may comprise, inter alia, a TFP dielectric material. The ground plane 230 is disposed between the dielectric 210 and the dielectric 220. The signal plane 260, which includes a conductive region 262, is disposed between the ground plane 230 and the power plane 240. Similarly, the signal plane 270, which includes a conductive region 272, is disposed between the ground plane 230 and the power plane 250. The power planes 240 and 250 may each be formed by process steps such those that formed the conductive plane 54 in FIG. 6. Accordingly, the power plane 240 includes a patterned metallic layer 244 on a patterned metal layer 242, wherein the metallic layer 244 protects the metal layer 242 from delaminating from the dielectric 210. Similarly, the power plane 250 includes a patterned metallic layer 254 on a patterned metal layer 252, wherein the metallic layer 254 protects the metal layer 252 from delaminating from the dielectric 220.

While preferred and particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. An electrical structure, comprising:
   a dielectric layer;
   a patterned layer on the dielectric layer, including a metal pattern on the dielectric layer, a metallic pattern on the metal pattern, and a plugged pattern having a dielectric material within a remaining space of the patterned layer; and
   a second dielectric layer on the patterned layer, adhesively bonded to a top surface of the patterned layer, wherein the second dielectric layer includes the dielectric material.

2. The electrical structure of claim 1, wherein the dielectric material includes a thermoplastic fluoropolymer (TFP) material.

3. The electrical structure of claim 2, wherein the TFP material is a Rogers 2800 material.

4. The electrical structure of claim 1, wherein the metal pattern includes copper.

5. The electrical structure of claim 1, wherein the metallic pattern includes chrome.

6. The electrical structure of claim 1, wherein a thickness of the metallic pattern is between about 800 Å and about 1200 Å.

7. The electrical structure of claim 1, wherein further comprising a plated through hole (PTH) through the second dielectric layer, through the patterned layer and encapsulated within the plugged pattern, and through the dielectric layer.

8. The electrical structure of claim 7, further comprising:
   a first circuitization layer on a surface of the second dielectric layer, wherein the first circuitization layer is electrically coupled to a first end of the PTH;
   a second circuitization layer on a surface of the dielectric layer, wherein the second circuitization layer is electrically coupled to a second end of the PTH;
   a first electronic device coupled to the first circuitization layer; and
   a second electronic device coupled to the second circuitization layer.

9. The electrical structure of claim 8, wherein the first electronic device is an electronic assembly, and wherein the second electronic device is an electronic carrier.

10. The electrical structure of claim 1, wherein the patterned layer includes a power plane, wherein the dielectric layer includes a ground plane and a signal plane, and wherein the signal plane is disposed between the ground plane and the power plane.

* * * * *